(12) United States Patent
Yang

(10) Patent No.: US 12,101,060 B2
(45) Date of Patent: Sep. 24, 2024

(54) OSCILLATOR ACCELERATION CIRCUIT, CHIP AND ELECTRONIC DEVICE

(71) Applicant: SHENZHEN GOODIX TECHNOLOGY CO., LTD., Guangdong (CN)

(72) Inventor: Bo Xin Yang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/175,509

(22) Filed: Feb. 27, 2023

(65) Prior Publication Data

US 2023/0291352 A1 Sep. 14, 2023

(30) Foreign Application Priority Data

Mar. 10, 2022 (CN) .......................... 202210228656.3

(51) Int. Cl.
*H03B 5/06* (2006.01)
*H03B 5/12* (2006.01)
(Continued)

(52) U.S. Cl.
CPC .............. *H03B 5/06* (2013.01); *H03B 5/1228* (2013.01); *H03B 5/24* (2013.01); *H03B 5/32* (2013.01); *H03B 2200/0038* (2013.01)

(58) Field of Classification Search
CPC .......... H03B 5/06; H03B 5/1228; H03B 5/24; H03B 2200/0034; H03B 2200/0038; H03B 5/364; H03B 5/32
(Continued)

(56) References Cited

U.S. PATENT DOCUMENTS 5,150,081 A * 9/1992 Goldberg ............. H03K 3/0307
331/109

FOREIGN PATENT DOCUMENTS

CN 102006057 A 4/2011
CN 103066942 A 4/2013
(Continued)

OTHER PUBLICATIONS

Office action and search report from counterpart China application 202210228656.3 dated Apr. 19, 2022.
(Continued)

*Primary Examiner* — Arnold M Kinkead
(74) *Attorney, Agent, or Firm* — WPAT, P.C.; Anthony King

(57) ABSTRACT

An oscillator acceleration circuit, configured to accelerate the start-up of an oscillator, wherein the oscillator has an input terminal and an output terminal. The oscillator acceleration circuit includes an inverting amplifier, a feedback resistor and an acceleration circuit; the inverting amplifier has an input terminal and an output terminal correspondingly coupled to the input terminal and the output terminal of the oscillator. The feedback resistor is coupled between the input terminal and the output terminal of the oscillator, and the acceleration circuit is coupled between the input terminal and the output terminal of the oscillator. The acceleration circuit is configured to provide a transfer function, wherein the transfer function is the same as the transfer function provided by a resistor and a capacitor connected in parallel; wherein the resistance of the resistor is less than zero.

20 Claims, 13 Drawing Sheets

(51) Int. Cl.
    *H03B 5/24*        (2006.01)
    *H03B 5/32*        (2006.01)
(58) Field of Classification Search
    USPC .......................................... 331/116 FE, 158
    See application file for complete search history.

(56) References Cited

FOREIGN PATENT DOCUMENTS

| CN | 109155610 | A |   | 1/2019  |
|----|-----------|---|---|---------|
| CN | 109314519 | A |   | 2/2019  |
| CN | 110224689 | A |   | 9/2019  |
| CN | 113346873 | A | * | 9/2021  |
| CN | 114006615 | A |   | 2/2022  |
| JP | 2005303639 | A |   | 10/2005 |

OTHER PUBLICATIONS

English abstract translation of Office action and search report from counterpart China application 202210228656.3 dated Apr. 19, 2022, CN113346873A, CN102006057A, CN103066942A, CN109314519A, CN110224689A, CN114006615A, CN109155610A, JP2005303639A.

* cited by examiner

OSCILLATOR ACCELERATION CIRCUIT, CHIP AND ELECTRONIC DEVICE

CROSS-REFERENCE TO RELATED APPLICATIONS

This application claims priority to PRC Patent Application No. 202210228656.3 filed Mar. 10, 2022, which is incorporated herein by reference for all purposes.

TECHNICAL FIELD

The present application relates to an oscillator, particularly an oscillator acceleration circuit, a chip and an electronic device.

BACKGROUND

Circuit systems usually require crystal oscillators to provide accurate clocks. Crystal clocks have performance such as excellent clock stability and low clock jitter compared to other clock oscillation circuits, such as RC relaxation oscillators, which are often used as clock sources for frequency multiplier clocks or frequency synthesizer clocks. However, the start-up time of crystal oscillators is relatively long; for example, the start-up time of MHz-level crystal oscillators is usually on the order of milliseconds, while the start-up time of KHz-level crystal oscillators is usually on the order of seconds; thus, in some cases where the crystal oscillator needs to be woken up quickly, such as for Bluetooth, additional fast start-up circuitry is needed to accelerate the start-up process of the crystal oscillator.

SUMMARY

The present application provides an oscillator acceleration circuit, for use in an acceleration circuit for accelerating the start-up process of the crystal oscillator.

The present application provides an oscillator acceleration circuit, configured to accelerate the start-up of the oscillator. The oscillator has an input terminal and an output terminal, and the oscillator acceleration circuit includes an inverting amplifier, a feedback resistor and an acceleration circuit. The inverting amplifier has an input terminal and an output terminal, correspondingly coupled to the input terminal and the output terminal of the oscillator, and a feedback resistor is coupled between the input terminal and the output terminal of the oscillator. The acceleration circuit is coupled between the input terminal and the output terminal of the oscillator, wherein the acceleration circuit is configured to provide a transfer function, wherein the transfer function is the same as the transfer function provided by a resistor and a capacitor connected in parallel, where the resistance of the resistor is less than zero.

The present application provides a chip, including the aforementioned oscillator acceleration circuit.

The present application provides an electronic device, including the aforementioned chip and the oscillator coupled to the chip.

The oscillator acceleration circuit of the present application can effectively allow the crystal oscillator to build up and get stabilized, thereby shortening the start-up time of the crystal oscillator.

BRIEF DESCRIPTION OF THE DRAWINGS

The following detailed description are discussed in connection with the accompanying drawings, and the accompanying drawings are briefly discussed below.

DETAILED DESCRIPTION

Figure 1:
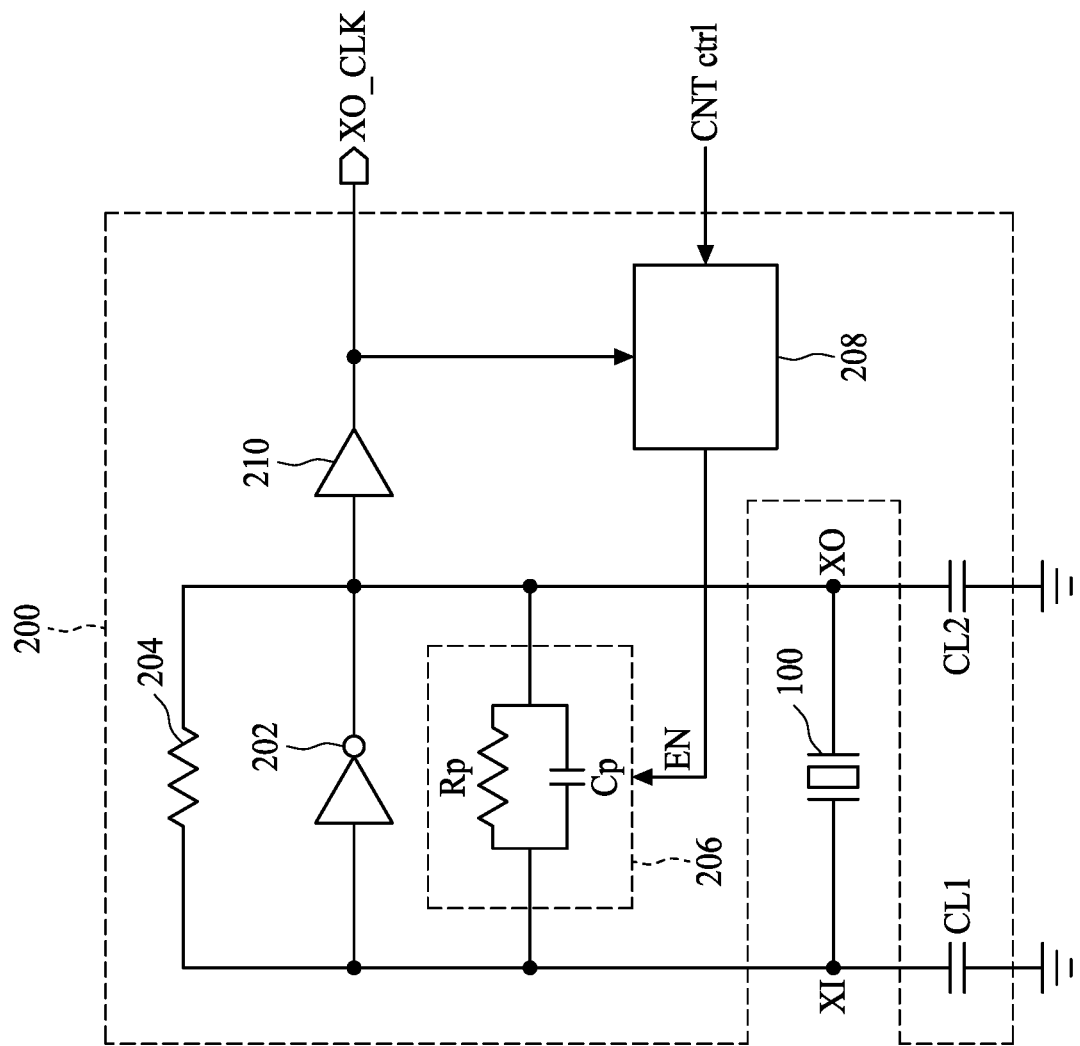
FIG. 1 is a circuit diagram illustrating an oscillating signal generation circuit according to one embodiment of the present disclosure.

The present disclosure provides several different implementations or embodiments that can be used to achieve different features of the present application. For the purpose of simplicity, the present disclosure also describes examples of particular components and arrangements. It should be noted that these particular examples are provided for illustration purposes only and are not intended to be limiting in any way. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in various embodiments; this repetition is used for the purpose of simplicity and clarity and does not in itself dictate a relationship between the various embodiments and/or configurations discussed. Further, in the description that follows, the term "coupled" indicates not only that the components are directly coupled to each other, but also that the components are coupled to each other and another set of components is inserted therebetween.

Figure 2:
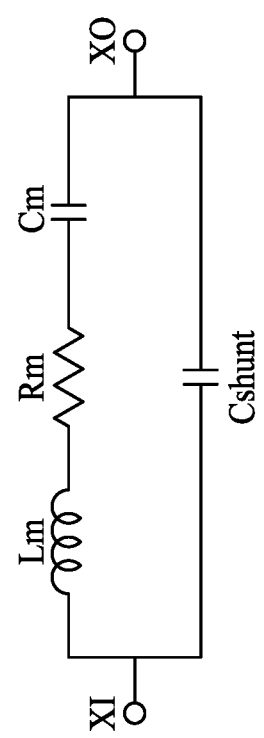
FIG. 2 illustrates an equivalent circuit diagram of the oscillator of FIG. 1.

FIG. 1 is a circuit diagram illustrating an oscillating signal generation circuit according to one embodiment of the present disclosure. Referring to FIG. 1, the oscillating signal generation circuit 10 includes an oscillator 100 and an oscillator acceleration circuit 200. The oscillator 100 has an input terminal XI and an output terminal XO. The oscillator acceleration circuit 200 is coupled between the input terminal XI and the output terminal XO of the oscillator 100, so as to allow the crystal oscillator to build up quickly and get stabilized, thereby shortening the start-up time of the crystal oscillator. In some embodiments, the oscillator 100 can be implemented using quartz crystal. FIG. 2 illustrates an equivalent circuit diagram of the oscillator of the present disclosure. Referring to FIG. 2, the oscillator 100 can include capacitors Cm and Cshunt, an inductor Lm and a resistor Rm; the inductor Lm, the resistor Rm and the capacitor Cm are connected in series and then connected in parallel with the capacitor Cshunt, and a terminal that the inductor Lm and the capacitor Cshunt coupled to is used as the input terminal XI of the oscillator 100, and a terminal that the capacitors Cm and Cshunt coupled to is used as the output terminal XO of the oscillator 100.

Referring again to FIG. 1, the oscillating signal generation circuit 200 includes an inverting amplifier 202, a feedback resistor 204 and an acceleration circuit 206. The input terminal of the inverting amplifier 202 is coupled to the input terminal XI of the oscillator 100, the output terminal of the inverting amplifier 202 is coupled to the output terminal XO of the oscillator 100, so as to provide energy for crystal start-up. The gain of the inverting amplifier 202 is a negative value, and the absolute value of the gain of the inverting amplifier 202 is greater than 1, so as to amplify the signal generated by the oscillator 100. An oscillating signal is outputted from the main signal output terminal XO_CLK as a clock signal used, for example, by an external circuit. In some embodiments, the oscillator 100 may generate a sine wave. The feedback resistor 204 is coupled between the input terminal XI and the output terminal XO of the oscillator 100. The acceleration circuit 206 is coupled between the input terminal XI and the output terminal XO of the oscillator 100; in other words, the acceleration circuit 206 is connected in parallel at both terminals of the inverting amplifier 204 The acceleration circuit 206 is configured to provide a transfer function, wherein the transfer function is the same as the transfer function provided by a resistor Rp and a capacitor Cp connected in parallel; wherein, the resistance of the resistor Rp is less than zero. The acceleration circuit 206 can provide additional drive capability to the oscillator 100 to speed up the start-up process.

The oscillator acceleration circuit 200 further includes a counter 208 and a buffer 210; the buffer 210 is coupled between the output terminal of the inverting amplifier 202 and the main signal output terminal XO_CLK. The counter 208 is coupled to the output terminal of the buffer 210; the counter 208 counts the number of cycles of the oscillating signal passed to the main signal output terminal XO_CLK and turns off the acceleration circuit 200 when it determines that the oscillator 100 has entered a stable state; thereby, additional losses caused by the acceleration circuit 200 and negative capacitance causing a shift in the oscillation frequency of the oscillator 100 can be avoided. The buffer 210 may be, for example, a pulse wave generator or a square wave buffer. In this case, the square wave may have a first state (high-level state) when the level of the sine wave outputted by the oscillator 100 is greater than a threshold of the buffer 210, and the square wave may have a second state (low-level state) when the level of the sine wave provided by the oscillator 100 is less than the threshold of the buffer 210. In some embodiments, the pulse wave generated by buffer 210 may be a rectangular waveform having a duty cycle of 50%, such as a square wave. In some embodiments, the pulse wave generated by buffer 210 may be a rectangular wave with a duty cycle that is not 50%.

Figure 3:
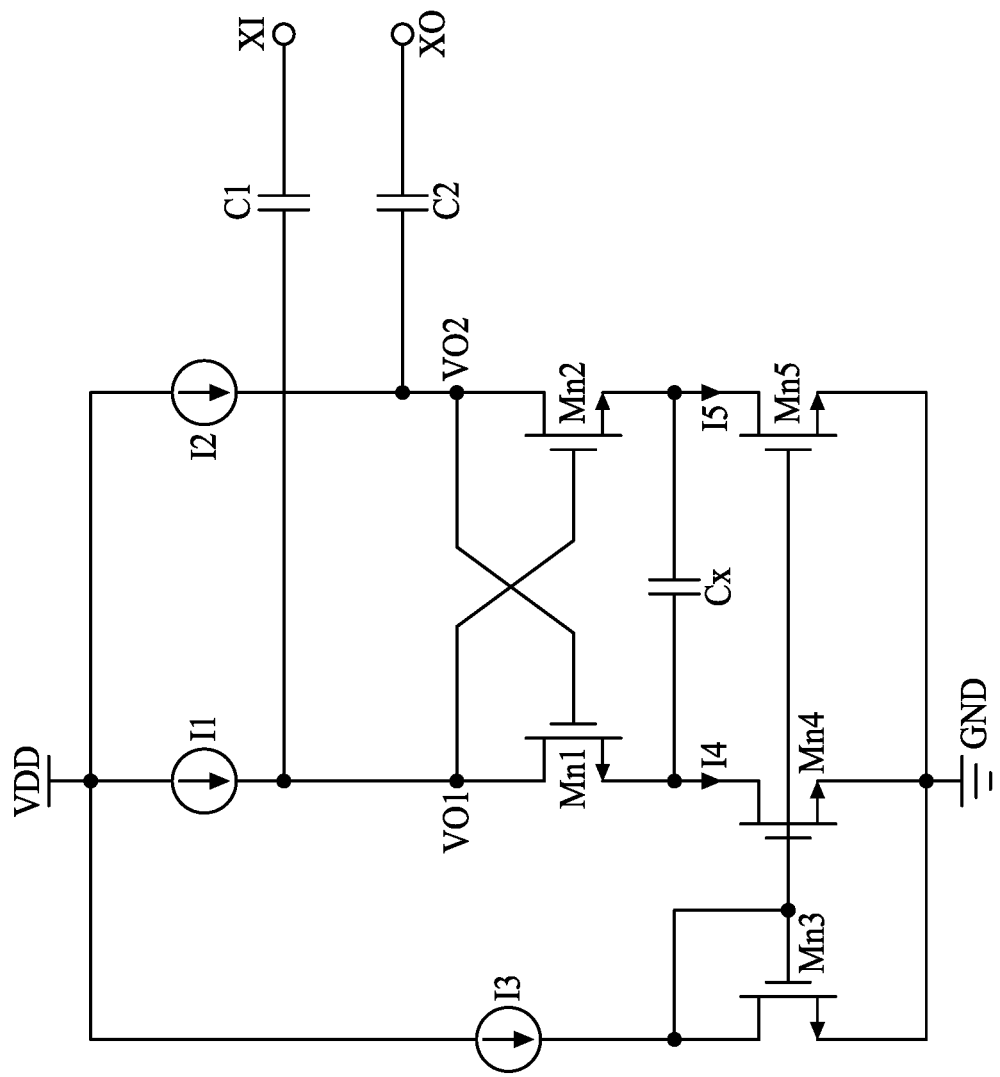
FIG. 3 is a circuit diagram illustrating an acceleration circuit of the oscillating signal generation circuit shown in FIG. 1 according to a first embodiment of the present disclosure.

The oscillator acceleration circuit 200 can further include a first load capacitor CL1 and a second load capacitor CL2; the first load capacitor CL1 is coupled to the input terminal XI of the oscillator 100, and the second load capacitor CL2 is coupled to the output terminal XO of the oscillator 100. Adjusting the first load capacitor CL1 and the second load capacitor CL2 can be used to reduce the effect of the capacitor Cshunt and the wiring capacitance in the parallel resonant circuit shown in FIG. 2 on the resonant frequency and improve the accuracy of the oscillation frequency. FIG. 3 is a circuit diagram illustrating the acceleration circuit 206 of the oscillating signal generation circuit 10 of FIG. 1. As discussed above, the acceleration circuit of FIG. 3 is configured to provide the transfer function, wherein the transfer function is the same as that provided by the resistor Rp and capacitor Cp connected in parallel; wherein the resistor Rp has a resistance value less than zero. Referring to FIG. 3, the acceleration circuit 206 can include a first N-type transistor Mn1, a second N-type transistor Mn2, a first capacitor C1, a second capacitor C2 and a third capacitor Cx. The first N-type transistor Mn1 and the second N-type transistor Mn2 form a mutual coupling pair, and cooperate with the third capacitor Cx to provide the negative impedance required by the acceleration circuit 206, so as to shorten the start-up time of the oscillator 100. In some embodiments, the first N-type transistor Mn1 and the second N-type transistor Mn2 have the same geometric dimensions (channel width, channel length) and electrical characteristics. More specifically, the drain of the first N-type transistor Mn1 is coupled to the first reference voltage VDD, and the source is coupled to the second reference voltage GND, wherein the first reference voltage VDD is higher than the second reference voltage GND. The drain of the second N-type transistor Mn2 is coupled to the first reference voltage VDD, and the source is coupled to the second reference voltage GND; the gate of the second N-type transistor Mn2 is coupled to the drain of the first N-type transistor Mn1, and the drain of the second N-type transistor Mn2 is coupled to the gate of the first N-type transistor Mn1. The third capacitor Cx is coupled between the source of the first N-type transistor Mn1 and the source of the second N-type transistor Mn2.

The first capacitor C1 is coupled between the drain of the first N-type transistor Mn1 and the input terminal XI of the oscillator 100 (as shown in FIG. 1), and the second capacitor C2 is coupled between the drain of the second N-type transistor Mn2 and the output terminal XO of the oscillator 100 (as shown in FIG. 1). In some embodiments, the first capacitor C1 and the second capacitor C2 have the same capacitance. The capacitance of the first capacitor C1 is smaller than the capacitance of the first load capacitor CL1 and the capacitance of the second load capacitor CL2, and the capacitor of the second capacitor C2 is smaller than the capacitance of the first load capacitor CL1 and the capacitance of the second load capacitor CL2. The first capacitor C1 and the second capacitor C2 have the function of isolating direct current, so as to avoid affecting the direct current bias point of other circuits.

The acceleration circuit 206 can further include a third N-type transistor Mn3, a fourth N-type transistor Mn4, a fifth N-type transistor Mn5, a first current source I1, a second current source I2 and a third current source I3. The third N-type transistor Mn3, the fourth N-type transistor Mn4, the fifth N-type transistor Mn5, and the third current source I3 form a current mirror, and the fourth N-type transistor Mn4 and the fifth N-type transistor Mn5 have the same geometric dimensions (channel width, channel length) and electrical characteristics. A drain of the third N-type transistor Mn3, in addition to being coupled to its own gate, can be further coupled to the first reference voltage VDD via the third current source I3; a source of the third N-type transistor Mn3 is connected to the ground. A drain of the fourth N-type transistor Mn4 is coupled to the source of the first N-type transistor Mn1, a gate of the fourth N-type transistor Mn4 is coupled to the gate of the third N-type transistor Mn3; a source of the fourth N-type transistor Mn4 is connected to the ground. A drain of the fifth N-type transistor Mn5 is coupled to the source of the second N-type transistor Mn2, a gate of the fifth N-type transistor Mn5 is coupled to the gate of the third N-type transistor Mn3; a source of the fifth N-type transistor Mn5 is connected to the ground. The first current source I1 is connected across the first reference voltage VDD and the drain of the first N-type transistor Mn1, and the second current source I2 is connected across the first reference voltage VDD and the drain of the second N-type transistor Mn2. In some embodiments, the current level provided by the first current source I1 is equal to the current level provided by the second current source I2 to reduce circuit design complexity. In some embodiments, the current ratio of the first current source I1 to the third current source I3 is equal to the ratio of the geometry dimensions (channel width, channel length) of the fourth N-type transistor Mn4 to the third N-type transistor Mn3; similarly, the current ratio of the second current source I2 to the third current source I3 is equal to the ratio of the geometry dimensions (channel width, channel length) ratio of the fifth N-type transistor Mn5 to the third N-type transistor Mn3.

Figure 4A:
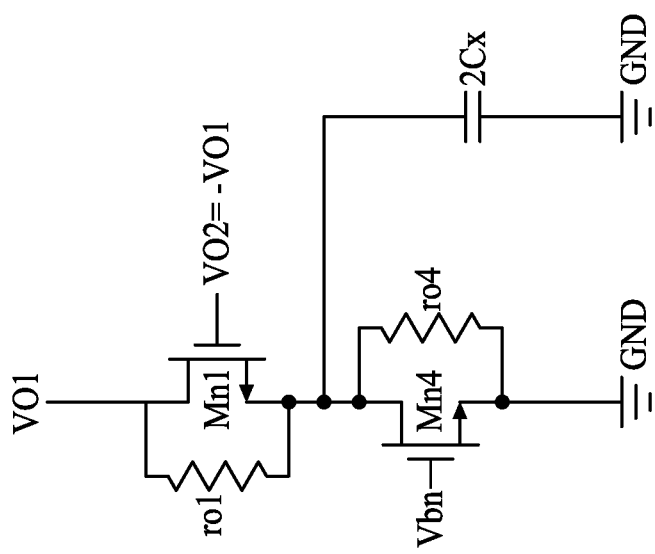
FIG. 4a is an impedance analysis diagram of the first N-type transistor, the second N-type transistor, the fourth N-type transistor, the fifth N-type transistor and the third capacitor shown in FIG. 3.
Figure 4B:
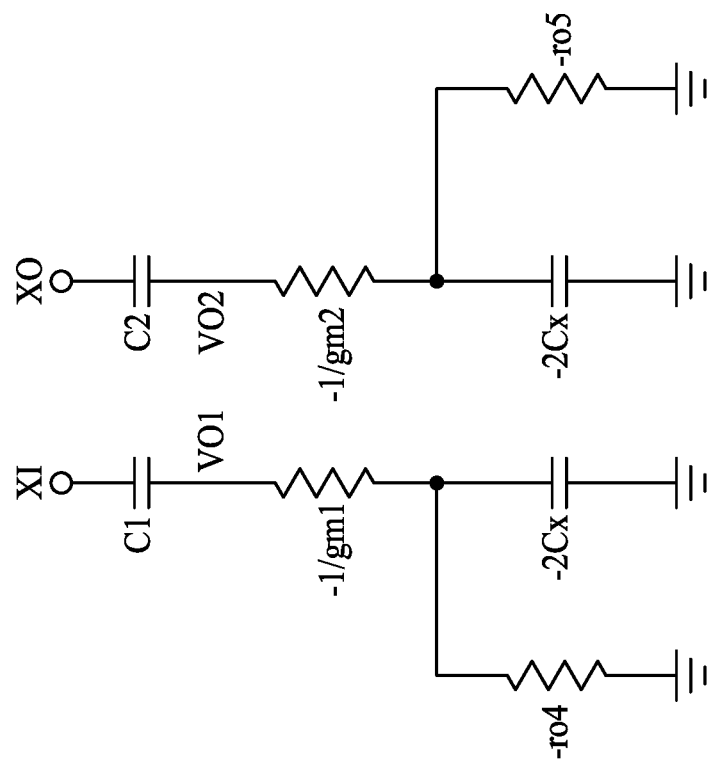
FIG. 4b illustrates the equivalent circuit of the first N-type transistor, the second N-type transistor, the fourth N-type transistor, the fifth N-type transistor, the first capacitor, the second capacitor and the third capacitor shown in FIG. 3.
Figure 4C:
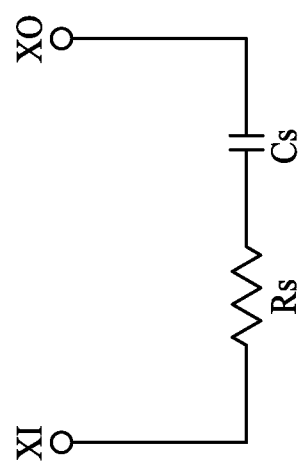
FIG. 4c illustrates an equivalent circuit diagram of FIG. 4b.

FIG. 4a is an impedance analysis diagram of the first N-type transistor Mn1, the second N-type transistor Mn2, the fourth N-type transistor Mn4, the fifth N-type transistor Mn5 and the third capacitor Cx shown in FIG. 3; FIG. 4b illustrates the equivalent circuit of the first N-type transistor Mn1, the second N-type transistor Mn2, the fourth N-type transistor Mn4, the fifth N-type transistor Mn5, first capacitor, second capacitor and the third capacitor Cx shown in FIG. 3; FIG. 4c illustrates an equivalent circuit diagram of FIG. 4b. Referring to FIG. 3 and FIG. 4a to FIG. 4c; as described above, the first N-type transistor Mn1 and the second N-type transistor Mn2 have the same geometric dimensions and electrical characteristics, the fourth N-type transistor Mn4 and the fifth N-type transistor Mn5 have the same geometric dimensions and electrical characteristics, and the current level provided by the first current source I1 is equal to the current level provided by the second current source, such that the first current I1 passes a path the same as the path that the second current I2 passes; thus, the following impedance characteristic analysis to the first N-type transistor Mn1, the second N-type transistor Mn2, the fourth N-type transistor Mn4 and the fifth N-type transistor Mn5 only considers the impedance on one current branch (e.g., the first current I1 branch), and hence, FIG. 4a only illustrates that the drain of the fourth N-type transistor Mn4 is coupled to the source of the first N-type transistor Mn1, and the third capacitor Cx is adjusted to a capacitor 2Cx, wherein a terminal of the capacitor 2Cx is coupled between the drain of the fourth N-type transistor Mn4 and the source of the first N-type transistor Mn1. The impedance $Z_1$ of node VO1 to ground shown in FIG. 4a can be expressed as follows:

$$gm1(-VO1 - I_1Z) + \frac{VO1 - I_1Z}{ro1} = I_1,$$

$$Z_1 = \frac{1 + \left(\frac{1}{ro1} + gm1\right)*Z}{\left(\frac{1}{ro1} - gm1\right)} = -\frac{1}{gm1} - Z$$

where Z is the parallel impedance of the output resistor ro4 of the fourth N-type transistor Mn4 and the capacitor 2Cx shown in FIG. 4a, gm1 is the transconductance of the first N-type transistor Mn1, ro1 is the output resistor of the first N-type transistor Mn1, and $$\frac{1}{ro1} \ll gm1,$$

the output impedance of the first current source I1 is infinite and can be ignored, so the impedance of the node VO1 is $Z_1$.

The main operating frequency of the oscillator 100 is at low to medium frequencies (i.e., oscillation frequencies of tens of thousands of Hz to tens of millions of Hz); when the operating frequency is at low frequencies, the impedance of the third capacitor Cx is much larger than the output resistor ro4 of the fourth N-type transistor Mn4 and the output resistor ro5 of the fifth N-type transistor Mn5, so the impedance $Z_1$ can be expressed as the following equation:

$$Z_1 = -\frac{1}{gm1} - ro4$$

Thus, the equivalent impedance between the nodes VO1 and VO2 can be expressed as:

$$2*\left(-\frac{1}{gm1} - ro4\right)$$

Of course, the equivalent impedance between the nodes VO1 and VO2 can be expressed as:

$$2*\left(-\frac{1}{gm2} - ro5\right)$$

Hence, the equivalent impedance between the input terminal XI and the output terminal XO of the oscillator 100 is:

$$Rs = 2*\left(-\frac{1}{gm1} - ro4\right)$$

where, $$Cs = \frac{C1}{2}$$

is a necessary condition.

Alternatively, the equivalent impedance between the input terminal XI and the output terminal XO of the oscillator 100 is:

$$Rs = 2 * \left(-\frac{1}{gm2} - ro5\right)$$

where, $$Cs = \frac{C2}{2}$$

is a necessary condition, gm2 is the transconductance of the second N-type transistor Mn2.

When the operating frequency is in the medium frequency (e.g. 1 M~48 M), the impedance of the third capacitor Cx is much smaller than the resistance of the output resistor ro4 of the fourth N-type transistor Mn4 and the resistance of the output resistor ro5 of the fifth N-type transistor Mn5, so the impedance $Z_1$ can be expressed as the following equation:

$$Z_1 = -\frac{1}{gm1} - \frac{1}{2Cx*S},$$

$$S = j*2\pi f,$$

f is the oscillation frequency

Then, the equivalent impedance between the nodes V01 and V02 can be expressed as:

$$2*\left(-\frac{1}{gm1}\right) + \frac{1}{-Cx*S}$$

or can be expressed as:

$$2*\left(-\frac{1}{gm2}\right) + \frac{1}{-Cx*S}$$

Consequently, the equivalent impedance between the input terminal XI and the output terminal XO of the oscillator 100 is:

$$Rs = 2*\left(-\frac{1}{gm1}\right)$$

$$Cs = \frac{\frac{C1}{2}*(-Cx)}{\frac{C1}{2} - Cx}$$

when $$\frac{C1}{2} - Cx > 0,$$

Cs acts as a negative capacitor, and when $$\frac{\frac{C1}{2}}{\frac{C1}{2} - Cx} > 1,$$

then Cs>Cx

The equivalent impedance between the input terminal XI and the output terminal XO of the oscillator 100 can also be expressed as:

$$Rs = 2*\left(-\frac{1}{gm2}\right)$$

$$Cs = \frac{\frac{C2}{2}*(-Cx)}{\frac{C2}{2} - Cx}$$

when $$\frac{C2}{2} - Cx > 0,$$

Cs acts as a negative capacitor, and when $$\frac{\frac{C2}{2}}{\frac{C2}{2} - Cx} > 1,$$

then has Cs>Cx

It can be seen that by adjusting the size of the first capacitor C1 and the second capacitor C2 shown in FIG. 3, the negative capacitance of the acceleration circuit 206 can be amplified and even double the capacitance, thereby minimizing the load capacitance to the greatest extent possible. When the acceleration circuit 206 is implemented with an integrated circuit, the capacitance multiplication effect provided by the first capacitor C1 and the second capacitor C2 allows the use of a third capacitor Cx with a smaller capacitance value, thus reducing the chip footprint.

Converting the series branches of Cs and Rs into parallel branches gives the type of acceleration circuit 206 in FIG. 1, i.e., Rp and Cp in parallel, where $$R_p = \left(1 + \frac{1}{Q^2}\right)*R_s$$

$$C_p = \frac{1}{1+Q^2}*C_s$$

where $Q^2=(R_s*C_s*\omega)^2$, $\omega$ is the angular frequency ($2\pi f$); given that the operating frequency of the crystal is usually in the low to medium frequency, there is $Q^2 \ll 1$, so there is $$R_p \approx \frac{1}{Q^2}*R_s,$$

$$C_p \approx C_s$$

In summary, when the crystal oscillator is operating at low frequencies, the acceleration circuit 206 can provide a negative resistance as well as a positive capacitance. The negative resistance provides greater drive capability for the oscillator 100 to start up, while the positive capacitance increases the load on the oscillator 100, so the capacitance of the first capacitor C1 and the second capacitor C2 need to be as low as possible in this application scenario to avoid affecting the start-up speed. In some embodiments, the capacitance of the first capacitor C1 and the second capacitor C2 are in the pF level. When the oscillator 100 is operating in the medium frequency band, the acceleration circuit 206 then provides a negative resistance as well as a negative capacitance to reduce the load capacitance at both terminals of the oscillator 100, thus further reducing the start-up time.

It should be noted that the acceleration circuit 206 of the present application is for illustrative purposes only, and that, in practice, variations can be made to the acceleration circuit 206 and obtain substantially the same effect. For example, in some embodiments, the polarity of the transistors in the acceleration circuit 206 can be changed and the circuit can be adjusted accordingly; in some embodiments, the way the current source of the acceleration circuit 206 is arranged can be changed. Three different embodiments are exemplified below for illustrative purposes.

Figure 5:
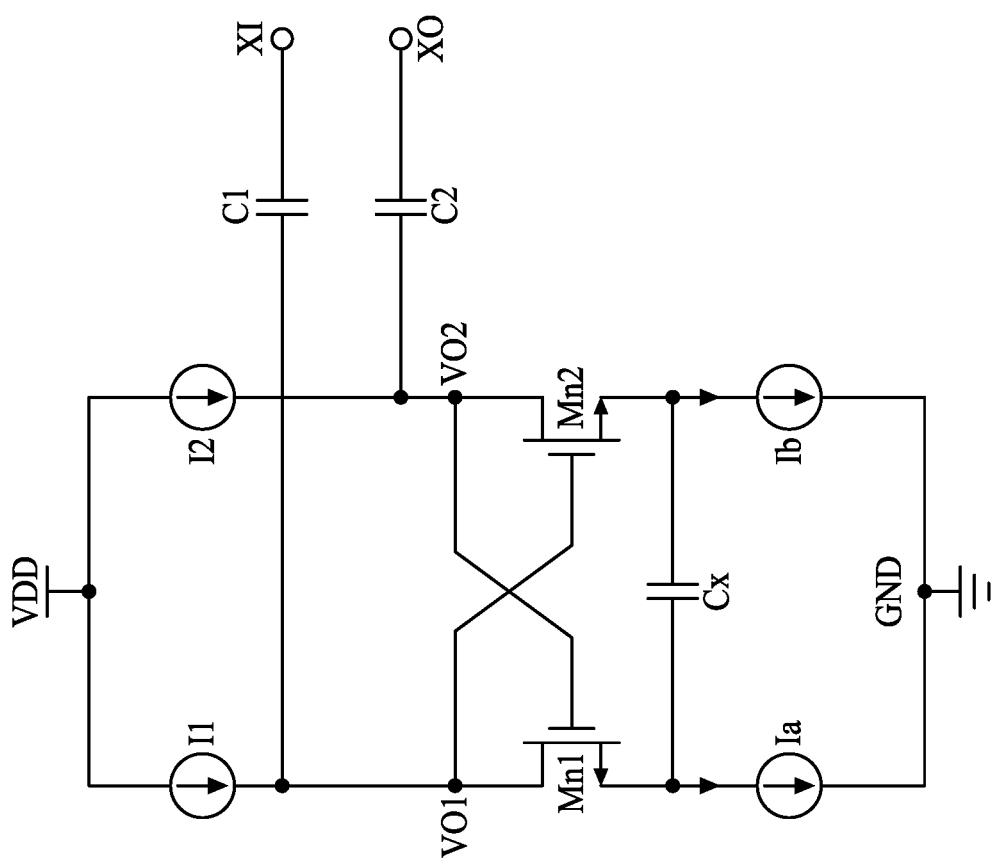
FIG. 5 is a circuit diagram illustrating an acceleration circuit of the oscillating signal generation circuit shown in FIG. 1 according to a second embodiment of the present disclosure.

FIG. 5 is a circuit diagram illustrating an acceleration circuit of the oscillating signal generation circuit shown in FIG. 1 according to a second embodiment of the present disclosure. Referring to FIG. 3 and FIG. 5; as discussed above, the acceleration circuit of FIG. 5 is configured to provide a transfer function, wherein the transfer function is the same as that provided by the resistor Rp and capacitor Cp connected in parallel; wherein, the resistance of the resistor Rp is less than zero. In FIG. 3, the third N-type transistor Mn3, the fourth N-type transistor Mn4, the fifth N-type transistor Mn5 and the third current source I3 of the acceleration circuit 206 forms a current mirror to provide a current I4 of the source of the first N-type transistor Mn1 and the current I5 of the source of second N-type transistor Mn2. To effectively reduce the circuit size and reduce cost, a fourth current source Ia and a fifth current source Ib can be directly disposed at the source of the first N-type transistor Mn1 and the source of the second N-type transistor Mn2 to provide the currents I4 and I5.

Figure 6:
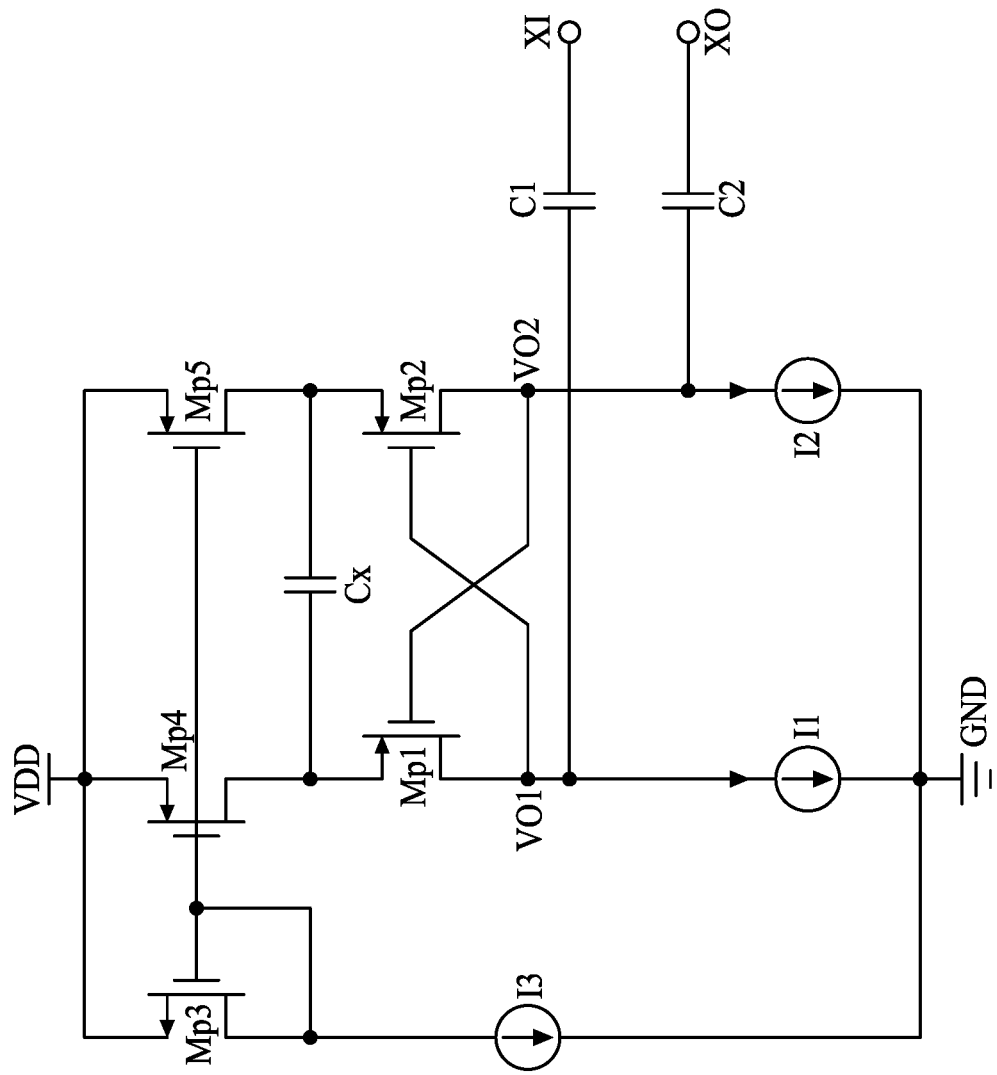
FIG. 6 is a circuit diagram illustrating an acceleration circuit of the oscillating signal generation circuit shown in FIG. 1 according to a third embodiment of the present disclosure.

FIG. 6 is a circuit diagram illustrating an acceleration circuit of the oscillating signal generation circuit shown in FIG. 1 according to a third embodiment of the present disclosure. As discussed above, the acceleration circuit of FIG. 6 is configured to provide a transfer function, wherein the transfer function is the same as that provided by the resistor Rp and capacitor Cp connected in parallel; wherein, the resistance of the resistor Rp is less than zero. Referring to FIG. 6, the acceleration circuit 206 can include a first P-type transistor Mp1, a second P-type transistor Mp2, a third P-type transistor Mp3, a fourth P-type transistor Mp4, a fifth P-type transistor Mp5, a first capacitor C1, a second capacitor C2, a third capacitor Cx, a first current source I1 and a second current source I2. The first P-type transistor Mp1 and the second P-type transistor Mp2 form a mutual coupling pair, and cooperate with the third capacitor Cx to provide the negative impedance required by the acceleration circuit 206. More specifically, a drain of the first P-type transistor Mp1 is coupled to the second reference voltage GND via the first current source I1, and its gate is coupled to the second reference voltage GND via the second current source I2. A drain of the second P-type transistor Mp2 is coupled to the gate of the first P-type transistor Mp1, and a gate of the second P-type transistor Mp2 is coupled to the drain of the first P-type transistor Mp1. In some embodiments, the first P-type transistor Mp1 and the second P-type transistor Mp2 have the same geometric dimensions (channel width, channel length) and electrical characteristics, and the first reference voltage VDD is greater than the second reference voltage GND. The third capacitor Cx is coupled between the source of the first P-type transistor Mp1 and the source of the second P-type transistor Mp2.

Figure 7:
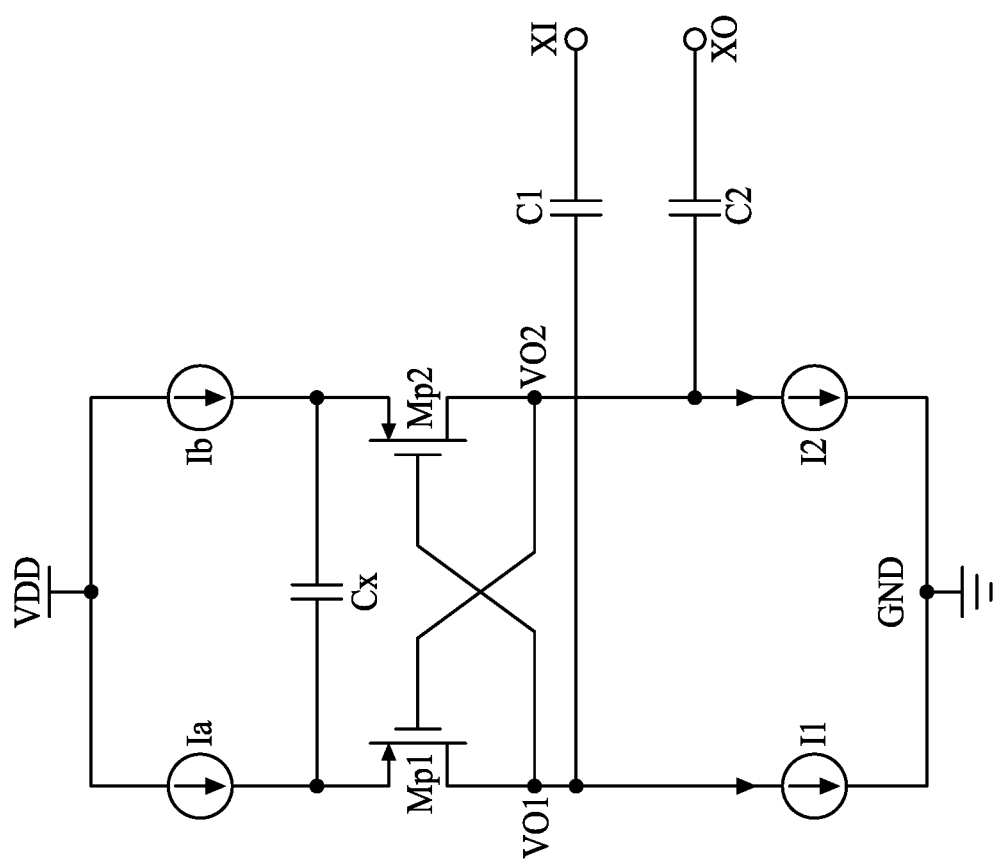
FIG. 7 is a circuit diagram illustrating an acceleration circuit of the oscillating signal generation circuit shown in FIG. 1 according to a fourth embodiment of the present disclosure.

The third P-type transistor Mp3, the fourth P-type transistor Mp4, the fifth P-type transistor Mp5 and the third current source I3 form a current mirror; wherein, the fourth P-type transistor Mp4 and the fifth P-type transistor Mp5 have the same geometric dimensions and electrical characteristics. The connection among the third to fifth P-type transistors Mp3-Mp5 is discussed in detail below. The sources of the third P-type transistor Mp3, the fourth P-type transistor Mp4 and the fifth P-type transistor Mp5 are respectively coupled to the first reference voltage VDD; the gate of the third P-type transistor Mp3 is coupled to its drain, and the drain is coupled to the second reference voltage GND via the third current source I3. The gate of the fourth P-type transistor Mp4 is coupled to the gate of the third P-type transistor Mp3, the drain of the fourth P-type transistor Mp4 is coupled to the source of the first P-type transistor Mp1. The gate the fifth P-type transistor Mp5 is coupled to the gate of the third P-type transistor Mp3, the drain the fifth P-type transistor Mp5 is coupled to the source of the second P-type transistor Mp2. The current mirror formed from the third P-type transistor Mp3, the fourth P-type transistor Mp4, the fifth P-type transistor Mp5 and the third current source I3 can, instead, be implemented using the fourth current source Ia disposed at the source of the first P-type transistor Mp1 and the fifth current source Ib disposed at the source the second P-type transistor Mp2, as shown in FIG. 7.

Referring to FIG. 6, the first capacitor C1 is coupled between the drain of the first P-type transistor Mp1 and the input terminal XI of the oscillator 100 (as shown in FIG. 1), the second capacitor C2 is coupled between the drain of the second P-type transistor Mp2 and the output terminal XO of the oscillator 100 (as shown in FIG. 1). In some embodiments, the first capacitor C1 and the second capacitor C2 have the same capacitance. The first capacitor C1 and the second capacitor C2 can further amplify the negative capacitance of the acceleration circuit 206, in addition to having the function of isolating the DC power.

Figure 8:
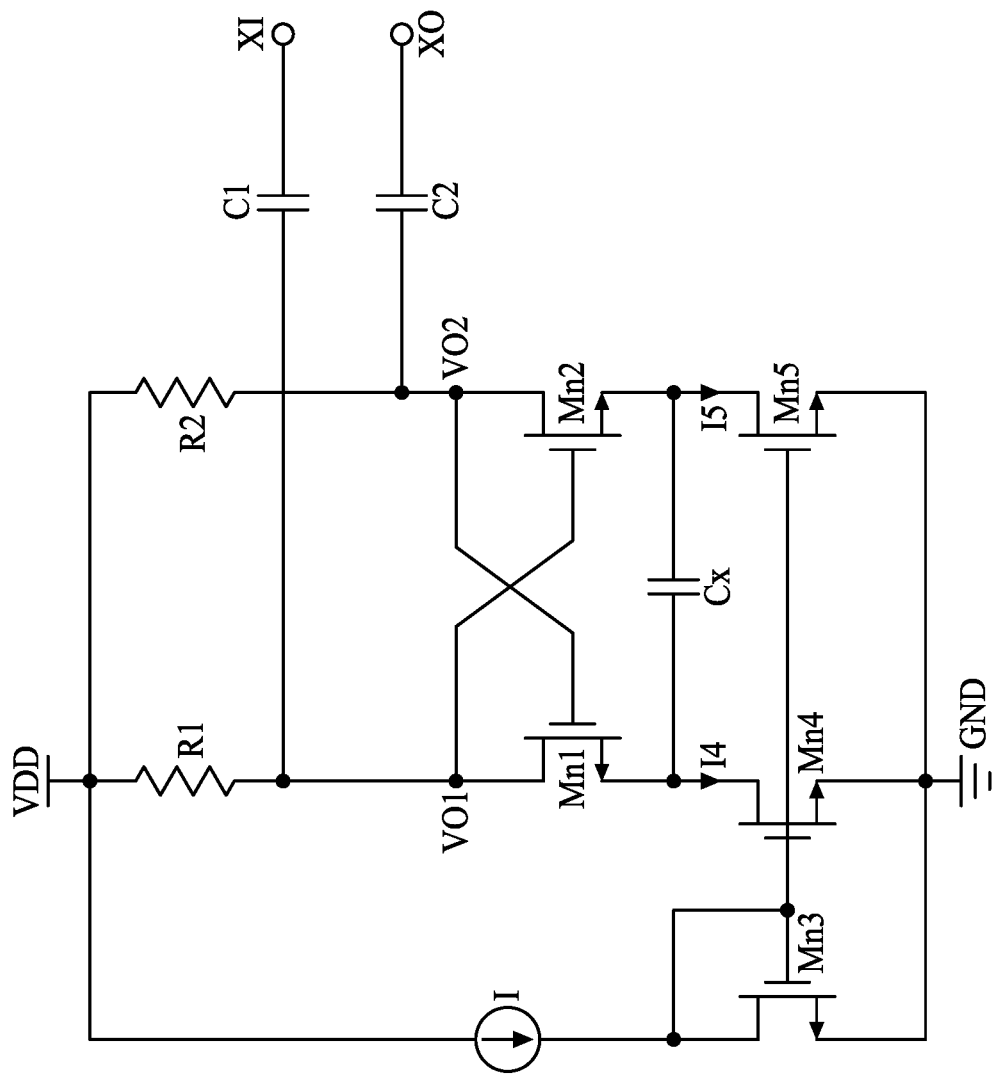
FIG. 8 is a circuit diagram illustrating an acceleration circuit of the oscillating signal generation circuit shown in FIG. 1 according to a fifth embodiment of the present disclosure.

FIG. 8 is a circuit diagram illustrating an acceleration circuit of the oscillating signal generation circuit shown in FIG. 1 according to a fifth embodiment of the present disclosure. As discussed above, the acceleration circuit of FIG. 8 is configured to provide a transfer function, wherein the transfer function is the same as that provided by the resistor Rp and the capacitor Cp connected in parallel; wherein, the resistance of the resistor Rp is less than zero. Referring to FIG. 8, the acceleration circuit 206 can include a first N-type transistor Mn1, a second N-type transistor Mn2, a third N-type transistor Mn3, a fourth N-type transistor Mn4, a fifth N-type transistor Mn5, a first capacitor C1, a second capacitor C2, a third capacitor Cx, a fixed-current source I, a first resistor R1 and a second resistor R2. A drain of the first N-type transistor Mn1 is coupled to the first reference voltage VDD via the first resistor R1, a gate of the first N-type transistor is coupled to the first reference voltage VDD via the second resistor R2; wherein, the first reference voltage VDD is greater than the second reference voltage GND. A drain of the second N-type transistor Mn2 is coupled to the gate of the first N-type transistor Mn1, a gate of the second N-type transistor Mn2 is coupled to the drain of the first N-type transistor Mn1. The first resistor R1 and the second resistor R2 have the same resistance. In some embodiments, the first N-type transistor Mn1 and the second N-type transistor Mn2 have the same geometric dimensions (channel width, channel length) and electrical characteristics. The third N-type transistor Mn3, the fourth N-type transistor Mn4, the fifth N-type transistor Mn5 and the fixed-current source I form a current mirror. More specifically, a drain of the third N-type transistor Mn3, in addition to being coupled to its own gate, is further coupled to the first reference voltage VDD via the fixed-current source I. The sources of the third N-type transistor Mn3, the fourth N-type transistor Mn4 and the fifth N-type transistor Mn5 are respectively coupled to the second reference voltage GND. The gates of the fourth N-type transistor Mn4 and the fifth N-type transistor Mn5 are respectively coupled to the gate of the third N-type transistor Mn3, the drain of the fourth N-type transistor Mn4 is coupled to the source of the first N-type transistor Mn1, and a drain of the fifth N-type transistor Mn5 is coupled to the source of the second N-type transistor Mn2; wherein, the fourth N-type transistor Mn4 and the fifth N-type transistor Mn5 may have the same geometric dimensions and electrical characteristics. In short, the third N-type transistor Mn3, the fourth N-type transistor Mn4, the fifth N-type transistor Mn5 and the fixed-current source I of the acceleration circuit 206 form a current mirror to provide the current I4 on the source of the first N-type transistor Mn1 and the current I5 on the source of second N-type transistor Mn2. Referring to FIG. 3 and FIG. 8, the device of FIG. 8 replaces the first current source I1 and the second current source I2 in FIG. 3 with the first resistor R1 and the second resistor R2, so as to get rid of the constrains that the current level of the second current source I2 must equal to the current level of the first current source I1, and that the current levels of the currents I4 and I5 must simultaneously equal to the current level of the first current source I1, thereby allowing a more flexible selection of the impedance. Ideally, the internal resistance of the first current source I1 and the second current source I2 is infinite; therefore, replacing the first current source I1 and the second current source I2 with the first resistor R1 and the second resistor R2, while effective in reducing circuit configuration costs, will reduce the equivalent negative impedance, thus making the acceleration circuit 206 less effective in accelerating the start-up of the crystal oscillator.

Figure 9:
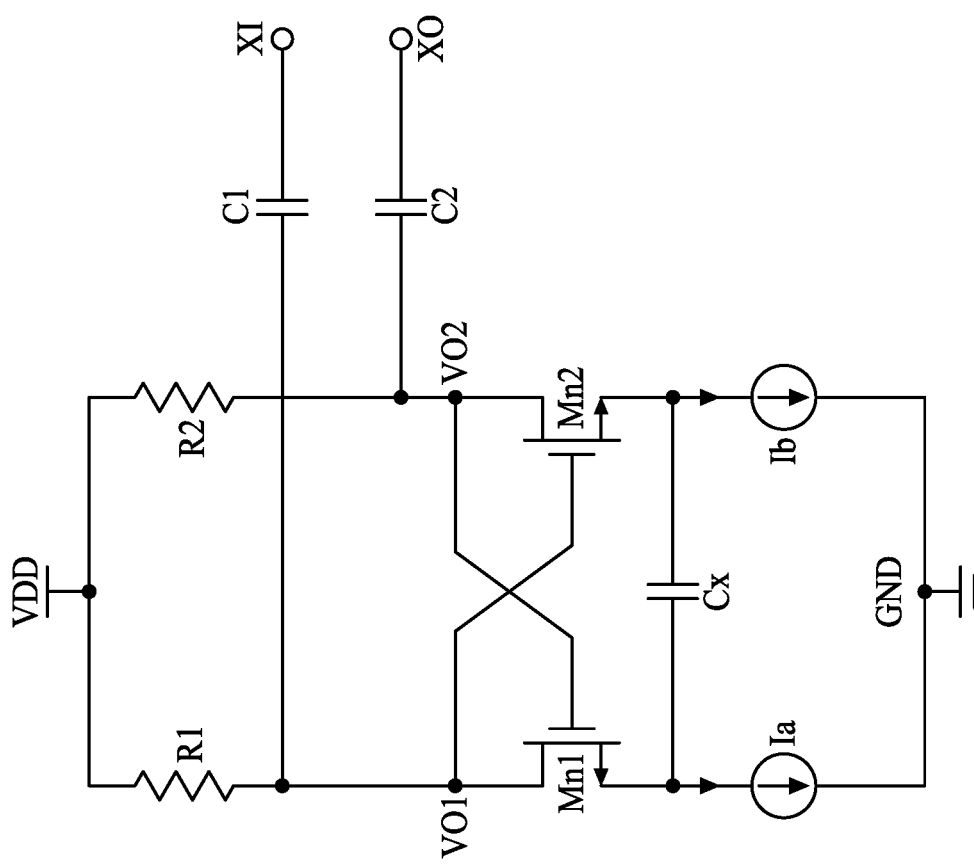
FIG. 9 is a circuit diagram illustrating an acceleration circuit of the oscillating signal generation circuit shown in FIG. 1 according to a sixth embodiment of the present disclosure.

Additionally, the current mirror formed by the third N-type transistor Mn3, the fourth N-type transistor Mn4, the fifth N-type transistor Mn5 and the fixed-current source I can be, instead, implemented by the fourth current source Ia disposed at the source of the first N-type transistor Mn1 and the fifth current source Ib disposed at the second N-type transistor Mn2 source, as shown in FIG. 9.

Referring again to FIG. 8, the first capacitor C1 is coupled between the drain of the first N-type transistor Mn1 and input terminal XI of the oscillator 100 (as shown in FIG. 1), and the second capacitor C2 is coupled between the drain of the second N-type transistor Mn2 and the output terminal XO of the oscillator 100 (as shown in FIG. 1). In certain embodiments, the first capacitor C1 and the second capacitor C2 have the same capacitance. The first capacitor C1 and the second capacitor C2 can further amplify the negative capacitance of the acceleration circuit 206, in addition to having the function of isolating the DC power. The third capacitor Cx is coupled between the source of the first N-type transistor Mn1 and the source of the second N-type transistor Mn2, and the first N-type transistor Mn1 and the second N-type transistor Mn2 jointly form a mutual coupling pair and cooperatively provide the negative impedance required by the acceleration circuit 206.

Figure 10:
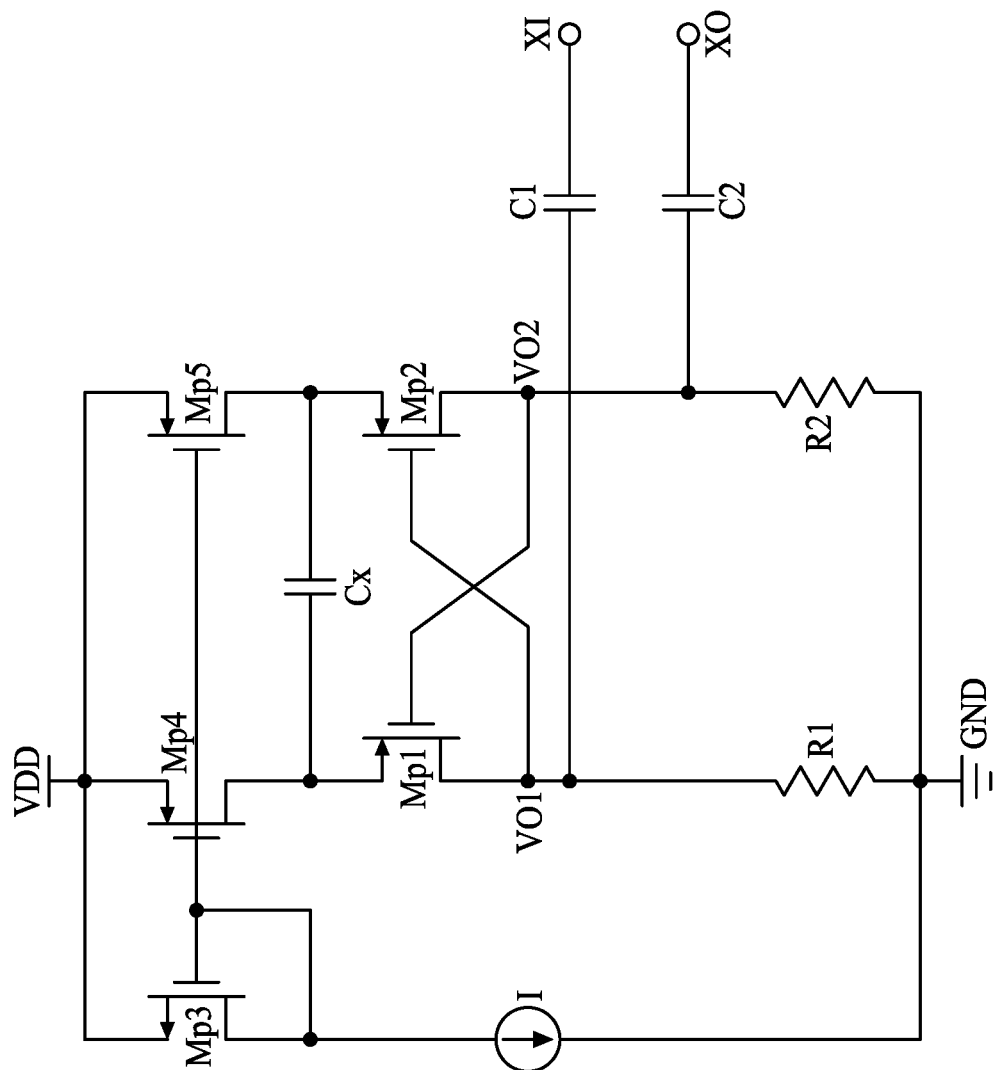
FIG. 10 is a circuit diagram illustrating an acceleration circuit of the oscillating signal generation circuit shown in FIG. 1 according to a seventh embodiment of the present disclosure.

FIG. 10 is a circuit diagram illustrating an acceleration circuit of the oscillating signal generation circuit shown in FIG. 1 according to a seventh embodiment of the present disclosure. As discussed above, the acceleration circuit of FIG. 10 is configured to provide a transfer function, wherein the transfer function is the same as that provided by the resistor Rp and the capacitor Cp connected in parallel; wherein, the resistance of the resistor Rp is less than zero. Referring to FIG. 10, the acceleration circuit 206 is coupled between the first reference voltage VDD and the second reference voltage GND, and can include a first P-type transistor Mp1, a second P-type transistor Mp2, a third P-type transistor Mp3, a fourth P-type transistor Mp4, a fifth P-type transistor Mp5, a first capacitor C1, a second capacitor C2, a third capacitor Cx, a current source I, a first resistor R1 and a second resistor R2. As shown FIG. 7, the drain of the first P-type transistor Mp1 is coupled to the second reference voltage GND via the first resistor R1, and a gate of the first P-type transistor Mp1 is coupled to the second reference voltage GND via the second resistor R2; wherein, the first reference voltage VDD is greater than the second reference voltage GND. A gate of the second P-type transistor Mp2 is coupled between the drain of the first P-type transistor Mp1, a drain of the second P-type transistor Mp2 is coupled to the gate of the first P-type transistor Mp1; the resistance of the first resistor R1 is equal to the resistance of the second resistor R2. In some embodiments, the first P-type transistor Mp1 and the second P-type transistor Mp2 have the same geometric dimensions (channel width, channel length) and electrical characteristics.

Figure 11:
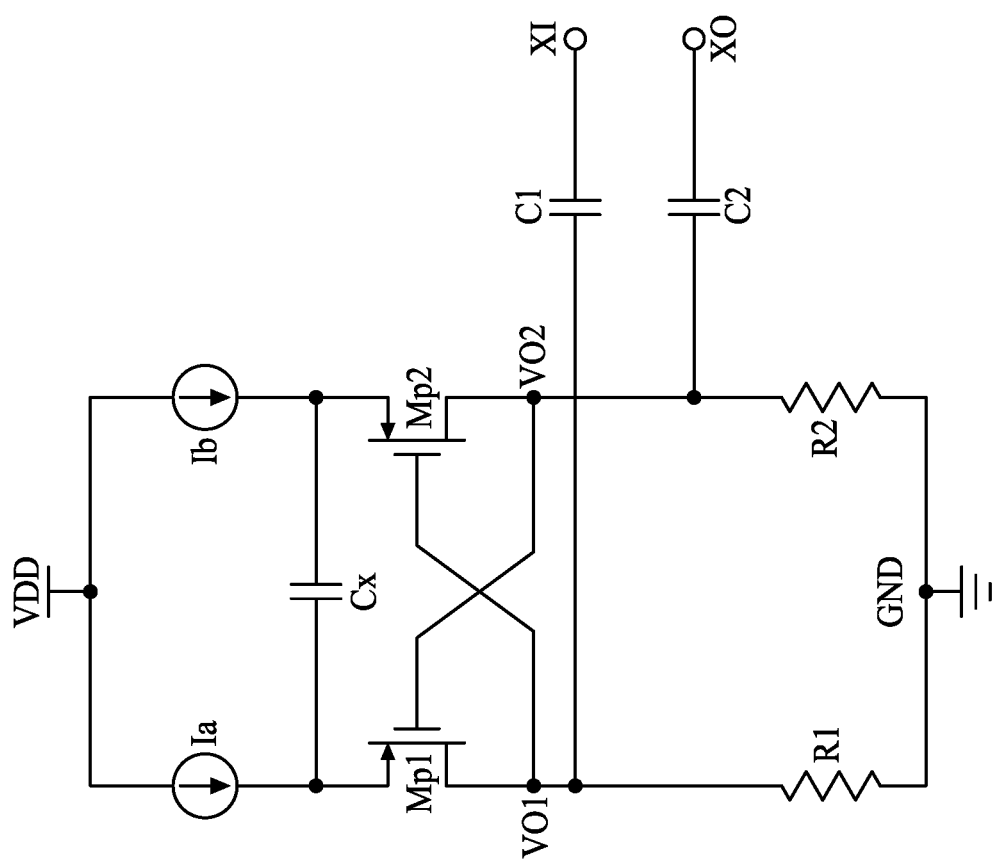
FIG. 11 is a circuit diagram illustrating an acceleration circuit of the oscillating signal generation circuit shown in FIG. 1 according to an eighth embodiment of the present disclosure.

The third P-type transistor Mp3, the fourth P-type transistor Mp4, the fifth P-type transistor Mp5 and the fixed-current source I form a current mirror. More specifically, the drain of the third P-type transistor Mp3, in addition to being coupled to its own gate, is further coupled to the second reference voltage GND via the fixed-current source I; the sources of third P-type transistor Mp3, the fourth P-type transistor Mp4 and the fifth P-type transistor Mp5 are respectively coupled to the first reference voltage VDD. The gates of the fourth P-type transistor Mp4 and the fifth P-type transistor Mp5 are respectively coupled to the gate of the third P-type transistor Mp3, the drain of the fourth P-type transistor Mp4 is coupled to the source of the first P-type transistor Mp1, and the drain the fifth P-type transistor Mp5 is coupled to the source of the second P-type transistor Mp2; wherein, the fourth P-type transistor Mp4 and the fifth P-type transistor Mp5 may have the same geometric dimensions and electrical characteristics. The current mirror formed by the third P-type transistor Mp3, the fourth P-type transistor Mp4, the fifth P-type transistor Mp5 and the fixed-current source I can be, instead, implemented by the fourth current source Ia disposed at the source the first P-type transistor Mp1 and the fifth current source Ib disposed at the source of the second P-type transistor Mp2, as shown in FIG. 11.

Referring again to FIG. 10, the first capacitor C1 is coupled between the drain of the first P-type transistor Mp1 and the input terminal XI of the oscillator 100 (as shown in FIG. 1), the second capacitor C2 is coupled between the drain of the second P-type transistor Mp2 and the output terminal XO of the oscillator 100 (as shown in FIG. 1); in some embodiments, the first capacitor C1 and the second capacitor C2 have the same capacitance. The third capacitor Cx is coupled between the source of the first P-type transistor Mp1 and the source of the second P-type transistor Mp2, and the first P-type transistor Mp1 and the second P-type transistor Mp2 jointly form a mutual coupling pair and cooperatively provide the negative impedance required by the acceleration circuit 206; the first capacitor C1 and the second capacitor C2 can further amplify the negative capacitance of the acceleration circuit 206, in addition to having the function of isolating the DC power.

The foregoing outlines features of several embodiments of the present application so that persons having ordinary skill in the art may better understand the various aspects of the present disclosure. Persons having ordinary skill in the art should appreciate that they may readily use the present disclosure as a basis for designing or modifying other processes and structures for carrying out the same purposes and/or achieving the same advantages of the embodiments introduced herein. Persons having ordinary skill in the art should also realize that such equivalent constructions do not depart from the spirit and scope of the present disclosure, and that they may make various changes, substitutions, and alternations herein without departing from the spirit and scope of the present disclosure.

What is claimed is:

1. An oscillator acceleration circuit, configured to accelerate start-up of an oscillator, wherein the oscillator has an input terminal and an output terminal, the oscillator acceleration circuit comprising:
   an inverting amplifier, having an input terminal and an output terminal correspondingly coupled to the input terminal and the output terminal of the oscillator;
   a feedback resistor, coupled between the input terminal and the output terminal of the oscillator; and
   an acceleration circuit, coupled between the input terminal and the output terminal of the oscillator, wherein the acceleration circuit is configured to provide a transfer function, wherein the transfer function is the same as a transfer function provided by a resistor and a capacitor connected in parallel, wherein a resistance of the resistor is less than zero when the oscillator operates at low to medium frequencies,
   wherein when the oscillator operates at the medium frequencies, a capacitance of the capacitor is less than zero.

2. The oscillator acceleration circuit of claim 1, wherein the acceleration circuit comprises:
   a first N-type transistor, wherein a drain of the first N-type transistor is coupled to a first reference voltage, and a source of the first N-type transistor is coupled to a second reference voltage, wherein the first reference voltage is greater than the second reference voltage;
   a second N-type transistor, wherein a drain of the second N-type transistor is coupled to the first reference voltage, a source of the second N-type transistor is coupled to the second reference voltage, a gate of the second N-type transistor is coupled to the drain of the first N-type transistor, and a gate of the first N-type transistor is coupled to the drain of the second N-type transistor;
   a first capacitor, coupled between the drain of the first N-type transistor and the input terminal of the oscillator;
   a second capacitor, coupled between the drain of the second N-type transistor and the output terminal of the oscillator; and
   a third capacitor, coupled between the source of the first N-type transistor and the source of the second N-type transistor.

3. The oscillator acceleration circuit of claim 2, wherein the acceleration circuit further comprises:
   a first current source, coupled between the drain of the first N-type transistor and the first reference voltage; and
   a second current source, coupled between the drain of the second N-type transistor and the first reference voltage,
   wherein a current level provided by the first current source is equal to a current level provided by the second current source.

4. The oscillator acceleration circuit of claim 3, wherein the acceleration circuit further comprises:
   a third N-type transistor, wherein a drain of the third N-type transistor is coupled to a gate of the third N-type transistor, wherein a source of the third N-type transistor is coupled to the second reference voltage;
   a fourth N-type transistor, wherein a gate of the fourth N-type transistor is coupled to the gate of the third N-type transistor, a drain of the fourth N-type transistor is coupled to the source of the first N-type transistor, and a source of the fourth N-type transistor is coupled to the second reference voltage;
   a fifth N-type transistor, wherein a gate of the fifth N-type transistor is coupled to the gate of the third N-type transistor, a drain of the fifth N-type transistor is coupled to the source of the second N-type transistor, and a source of the fifth N-type transistor is coupled to the second reference voltage; and
   a third current source, coupled between the drain of the third N-type transistor and the first reference voltage.

5. The oscillator acceleration circuit of claim 3, wherein the acceleration circuit further comprises:
   a fourth current source, coupled between the source of the first N-type transistor and the second reference voltage; and
   a fifth current source, coupled between the source of the second N-type transistor and the second reference voltage.

6. The oscillator acceleration circuit of claim 2, wherein the acceleration circuit further comprises:
   a first resistor, coupled between the drain of the first N-type transistor and the first reference voltage; and
   a second resistor, coupled between the drain of the second N-type transistor and the first reference voltage,
   wherein a resistance of the first resistor is equal to a resistance of the second resistor.

7. The oscillator acceleration circuit of claim 6, wherein the acceleration circuit further comprises:
   a third N-type transistor, wherein a drain of the third N-type transistor is coupled to a gate of the third N-type transistor, and a source of the third N-type transistor is coupled to the second reference voltage;
   a fourth N-type transistor, wherein a gate of the fourth N-type transistor is coupled to the gate of the third N-type transistor, a drain of the fourth N-type transistor is coupled to the source of the first N-type transistor, and a source of the fourth N-type transistor is coupled to the second reference voltage;
   a fifth N-type transistor, wherein a gate of the fifth N-type transistor is coupled to the gate of the third N-type transistor, a drain of the fifth N-type transistor is coupled to the source of the second N-type transistor, and a source of the fifth N-type transistor is coupled to the second reference voltage; and a fixed-current source, coupled between the drain of the third N-type transistor and the first reference voltage.

8. The oscillator acceleration circuit of claim 6, wherein the acceleration circuit further comprises:
   a fourth current source, coupled between the source of the first N-type transistor and the second reference voltage; and
   a fifth current source, coupled between the source of the second N-type transistor and the second reference voltage.

9. The oscillator acceleration circuit of claim 1, wherein the acceleration circuit comprises:
   a first P-type transistor, wherein a source of the first P-type transistor is coupled to a first reference voltage, a drain of the first P-type transistor is coupled to a second reference voltage, wherein the first reference voltage is greater than the second reference voltage;
   a second P-type transistor, wherein a source of the second P-type transistor is coupled to the first reference voltage, a drain of the second P-type transistor is coupled to the second reference voltage, a gate of the second P-type transistor is coupled to the drain of the first P-type transistor, and a gate of the first P-type transistor is coupled to the drain of the second P-type transistor;
   a first capacitor, coupled between the drain of the first P-type transistor and the input terminal of the oscillator;
   a second capacitor, coupled between the drain of the second P-type transistor and the output terminal of the oscillator; and
   a third capacitor, coupled between the source of the first P-type transistor and the source of the second P-type transistor.

10. The oscillator acceleration circuit of claim 9, wherein the acceleration circuit further comprises:
    a first current source, coupled between the drain of the first P-type transistor and the second reference voltage;
    a second current source, coupled between the drain of the second P-type transistor and the second reference voltage,
    wherein a current level provided by the first current source is equal to a current level provided by the second current source.

11. The oscillator acceleration circuit of claim 10, wherein the acceleration circuit further comprises:
    a third P-type transistor, wherein a source of the third P-type transistor is coupled to the first reference voltage, and a drain of the third P-type transistor is coupled to a gate of the third P-type transistor;
    a fourth P-type transistor, wherein a gate of the fourth P-type transistor is coupled to the gate of the third P-type transistor, a drain of the fourth P-type transistor is coupled to the source of the first P-type transistor, and a source of the fourth P-type transistor is coupled to the first reference voltage;
    a fifth P-type transistor, wherein a gate of the fifth P-type transistor is coupled to the gate of the third P-type transistor, a drain of the fifth P-type transistor is coupled to the source of the second P-type transistor, and a source of the fifth P-type transistor is coupled to the first reference voltage; and
    a third current source, coupled between the drain of the third P-type transistor and the second reference voltage.

12. The oscillator acceleration circuit of claim 10, wherein the acceleration circuit further comprises:
    a fourth current source, coupled between the source of the first P-type transistor and the first reference voltage; and
    a fifth current source, coupled between the source of the second P-type transistor and the first reference voltage.

13. The oscillator acceleration circuit of claim 9, wherein the acceleration circuit further comprises:
    a first resistor, coupled between the drain of the first P-type transistor and the second reference voltage; and
    a second resistor, coupled between the drain of the second P-type transistor and the second reference voltage,
    wherein a resistance of the first resistor is equal to a resistance of the second resistor.

14. The oscillator acceleration circuit of claim 13, wherein the acceleration circuit further comprises:
    a third P-type transistor, wherein a drain of the third P-type transistor is coupled to a gate of the third P-type transistor, and a source of the third P-type transistor is coupled to the first reference voltage;
    a fourth P-type transistor, wherein a gate of the fourth P-type transistor is coupled to the gate of the third P-type transistor, a drain of the fourth P-type transistor is coupled to the source of the first P-type transistor, and a source of the fourth P-type transistor is coupled to the first reference voltage;
    a fifth P-type transistor, wherein a gate of the fifth P-type transistor is coupled to the gate of the third P-type transistor, a drain of the fifth P-type transistor is coupled to the source of the second P-type transistor, and a source of the fifth P-type transistor is coupled to the first reference voltage; and
    a fixed-current source, coupled between the drain of the third P-type transistor and the second reference voltage.

15. The oscillator acceleration circuit of claim 13, wherein the acceleration circuit further comprises:
    a fourth current source, coupled between the first reference voltage and the source of the first P-type transistor; and
    a fifth current source, coupled between the first reference voltage and the source of the second P-type transistor.

16. The oscillator acceleration circuit of claim 1, wherein when the oscillator operates at the low frequencies, a capacitance of the capacitor is greater than zero, the medium frequencies is between about 1 MHz and about 48 MHz, and the low frequencies is between about 10 kHz and about 1 MHz.

17. The oscillator acceleration circuit of claim 1, further comprising a counter, coupled between the output terminal of the oscillator and the acceleration circuit, wherein the counter controls the acceleration circuit according to an oscillating signal generated by the oscillator.

18. An oscillator acceleration circuit, configured to accelerate start-up of an oscillator, wherein the oscillator has an input terminal and an output terminal, the oscillator acceleration circuit comprising:
    an inverting amplifier, having an input terminal and an output terminal correspondingly coupled to the input terminal and the output terminal of the oscillator;
    a feedback resistor, coupled between the input terminal and the output terminal of the oscillator; and
    an acceleration circuit, comprising:
      a first N-type transistor, wherein a drain of the first N-type transistor is coupled to a first reference voltage, and a source of the first N-type transistor is coupled to a second reference voltage, wherein the first reference voltage is greater than the second reference voltage;

a second N-type transistor, wherein a drain of the second N-type transistor is coupled to the first reference voltage, a source of the second N-type transistor is coupled to the second reference voltage, a gate of the second N-type transistor is coupled to the drain of the first N-type transistor, and a gate of the first N-type transistor is coupled to the drain of the second N-type transistor;

a first capacitor, coupled between the drain of the first N-type transistor and the input of the oscillator;

a second capacitor, coupled between the drain of the second N-type transistor and the output terminal of the oscillator; and a third capacitor, coupled between the source of the first N-type transistor and the source of the second N-type transistor.

19. The oscillator acceleration circuit of claim 18, wherein the acceleration circuit further comprises:

a third N-type transistor, wherein a drain of the third N-type transistor is coupled to a gate of the third N-type transistor, and a source of the third N-type transistor is coupled to the second reference voltage;

a fourth N-type transistor, wherein a gate of the fourth N-type transistor is coupled to the gate of the third N-type transistor, a drain of the fourth N-type transistor is coupled to the source of the first N-type transistor, and a source of the fourth N-type transistor is coupled to the second reference voltage;

a fifth N-type transistor, wherein a gate of the fifth N-type transistor is coupled to the gate of the third N-type transistor, a drain of the fifth N-type transistor is coupled to the source of the second N-type transistor, and a source of the fifth N-type transistor is coupled to the second reference voltage;

a first current source, coupled between the drain of the first N-type transistor and the first reference voltage;

a second current source, coupled between the drain of the second N-type transistor and the first reference voltage; and a third current source, coupled between the drain of the third N-type transistor and the first reference voltage.

20. An oscillator acceleration circuit, configured to accelerate start-up of an oscillator, wherein the oscillator has an input terminal and an output terminal, the oscillator acceleration circuit comprising:

an inverting amplifier, having an input terminal and an output terminal corresponding coupled to the input terminal and the output terminal of the oscillator;

a feedback resistor, coupled between the input terminal and the output terminal of the oscillator; and an acceleration circuit, comprising:

a first P-type transistor, wherein a source of the first P-type transistor is coupled to a first reference voltage, a drain of the first P-type transistor is coupled to a second reference voltage, wherein the first reference voltage is greater than the second reference voltage;

a second P-type transistor, wherein a source of the second P-type transistor is coupled to the first reference voltage, a drain of the second P-type transistor is coupled to the second reference voltage, a gate of the second P-type transistor is coupled to the drain of the first P-type transistor, and a gate of the first P-type transistor is coupled to the drain of the second P-type transistor;

a first capacitor, coupled between the drain of the first P-type transistor and the input terminal of the oscillator;

a second capacitor, coupled between the drain of the second P-type transistor and the output terminal of the oscillator; and a third capacitor, coupled between the source of the first P-type transistor and the source of the second P-type transistor.

* * * * *